United States Patent
Mori

(10) Patent No.: US 11,424,004 B2
(45) Date of Patent: Aug. 23, 2022

(54) MEMORY SYSTEM AND MANAGEMENT METHOD OF CHARACTERISTIC INFORMATION OF SEMICONDUCTOR DEVICE

(71) Applicant: Kioxia Corporation, Tokyo (JP)

(72) Inventor: Junji Mori, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 23 days.

(21) Appl. No.: 17/190,906

(22) Filed: Mar. 3, 2021

(65) Prior Publication Data
US 2022/0005543 A1 Jan. 6, 2022

(30) Foreign Application Priority Data
Jul. 2, 2020 (JP) .............................. JP2020-115075

(51) Int. Cl.
| | |
|---|---|
| *G11C 29/50* | (2006.01) |
| *G11C 29/00* | (2006.01) |
| *G11C 29/44* | (2006.01) |
| *G11C 16/04* | (2006.01) |

(52) U.S. Cl.
CPC ........ *G11C 29/50012* (2013.01); *G11C 29/44* (2013.01); *G11C 29/70* (2013.01); *G11C 16/0483* (2013.01)

(58) Field of Classification Search
CPC .......... G11C 29/50012; G11C 16/0483; G11C 29/70; G11C 29/44
USPC ....................................... 714/721, 724, 718
See application file for complete search history.

(56) References Cited

U.S. PATENT DOCUMENTS

| | | | | |
|---|---|---|---|---|
| 5,828,758 | A * | 10/1998 | Byce | G09B 21/00 |
| | | | | 381/70 |
| 6,941,077 | B2 * | 9/2005 | Aronson | G01M 11/00 |
| | | | | 398/137 |
| 7,904,182 | B2 | 3/2011 | Hosek et al. | |
| 10,107,649 | B2 * | 10/2018 | Dobyns | G01D 5/244 |
| 10,224,107 | B1 * | 3/2019 | Sule | G11C 16/12 |
| 11,200,961 | B1 * | 12/2021 | Uribe | G11C 29/44 |

(Continued)

FOREIGN PATENT DOCUMENTS

| | | |
|---|---|---|
| JP | 2008-543578 A | 12/2008 |
| JP | 2010-191485 A | 9/2010 |

OTHER PUBLICATIONS

Bilinskis et al., Alias-free compressed signal digitizing and recording on the basis of Event Timer, Nov. 26-28, 2013, IEEE, pp. 443-446. (Year: 2013).*

*Primary Examiner* — John J Tabone, Jr.
(74) *Attorney, Agent, or Firm* — Foley & Lardner LLP

(57) ABSTRACT

A memory system includes a non-volatile memory and a memory controller that controls the non-volatile memory. The memory controller includes a monitor circuit to generate a monitor signal indicating at least one characteristic that varies based on a variation in a manufacturing process condition under which the memory controller was manufactured; a digitization circuit to digitize the monitor signal at a plurality of timings to generate a plurality of digitized monitor signals, each of the plurality of digitized monitor signals having a first size; and a compression circuit to compress the plurality of digitized monitor signals data into first data having the first size.

20 Claims, 5 Drawing Sheets

(56) References Cited

U.S. PATENT DOCUMENTS

| | | | |
|---|---|---|---|
| 2004/0108866 A1* | 6/2004 | Burns | H01L 22/20 348/E7.052 |
| 2011/0179868 A1* | 7/2011 | Kaino | G01C 19/5776 73/504.12 |
| 2014/0211579 A1* | 7/2014 | Lovelace | G11C 29/028 365/200 |
| 2015/0380094 A1* | 12/2015 | Nagashima | G11C 16/14 365/185.19 |
| 2017/0371565 A1* | 12/2017 | Liu | G06F 3/064 |
| 2019/0102097 A1* | 4/2019 | Madraswala | G06F 3/0679 |
| 2019/0179482 A1* | 6/2019 | Ghosh | G06F 3/0416 |
| 2021/0034251 A1* | 2/2021 | Choi | G11C 16/349 |
| 2021/0304817 A1* | 9/2021 | Mantegazza | G11C 29/12005 |
| 2022/0005543 A1* | 1/2022 | Mori | G11C 29/44 |

* cited by examiner

FIG. 8
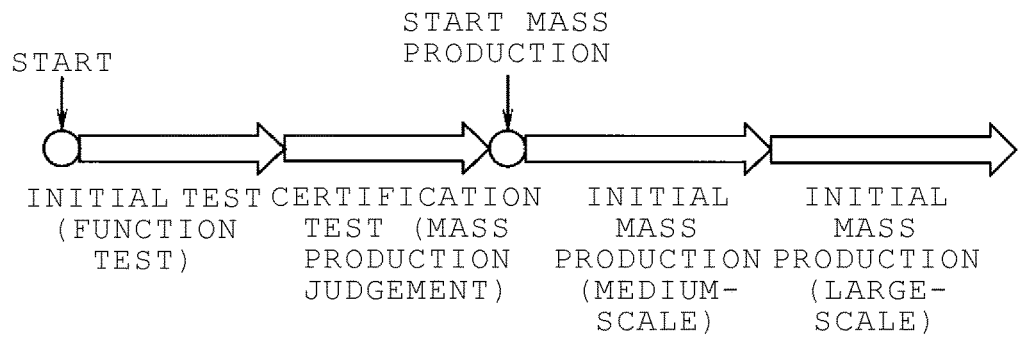
FIG. 9
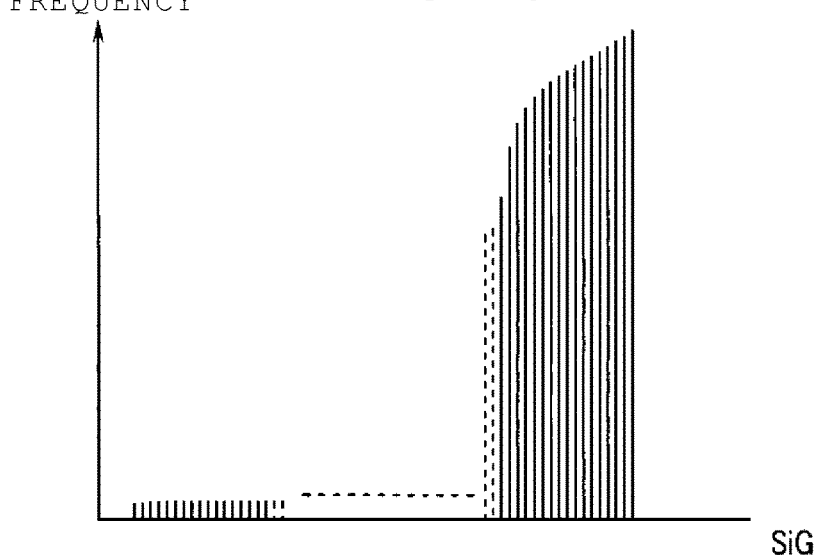
FIG. 10

MEMORY SYSTEM AND MANAGEMENT METHOD OF CHARACTERISTIC INFORMATION OF SEMICONDUCTOR DEVICE

CROSS-REFERENCE TO RELATED APPLICATION

This application is based upon and claims the benefit of priority from Japanese Patent Application No. 2020-115075, filed on Jul. 2, 2020, the entire contents of which are incorporated herein by reference.

FIELD

Embodiments described herein relate generally to a memory system, a memory controller, and a management method of characteristic information of a semiconductor device.

BACKGROUND

In manufacturing a semiconductor device, to prevent defective products from being shipped, shipping tests are performed on each semiconductor device before mass production shipment. The shipping test is carried out for various test items related to various required specifications set before mass production. The shipping test is performed on each semiconductor device according to a predetermined test method for predetermined test items.

In the shipping test, for example, each semiconductor device is tested in each test item to check whether the semiconductor device operates normally in comparison with a pass criterion of each test item. In recent years, for example, a ring oscillator for characteristic evaluation is embedded in a semiconductor device, and various characteristics of the semiconductor device are also evaluated from the oscillation frequency of the ring oscillator.

It is not possible to test each semiconductor device under various operating conditions and under all combinations of operating conditions in terms of cost. Therefore, in general, the shipping test is performed only under a limited plurality of predetermined operating conditions.

Therefore, when there is a defective product among the semiconductor devices shipped, the cause of defects cannot be easily identified.

DESCRIPTION OF THE DRAWINGS

FIG. 8 is a view illustrating an example of process characteristic data according to the embodiment.

FIG. 9 is a view illustrating a process from trial production to mass production of the semiconductor device according to the embodiment.

FIG. 10 is a view illustrating an example of a histogram of signature codes according to the embodiment.

DETAILED DESCRIPTION

Embodiments provide a memory system, a memory controller, and a management method of characteristic information of a semiconductor device that prevent defective products from being shipped to the market by detecting a characteristic change that is not large enough to cause defects in a shipping test, and make it easy to analyze the cause of defects.

According to one embodiment, a memory system includes: a non-volatile memory; and a memory controller that controls the non-volatile memory and includes at least one monitor circuit configured to generate a monitor signal indicating at least one characteristic that varies based on a variation in a manufacturing process condition under which the memory controller was manufactured; a digitization circuit configured to digitize the monitor signal at a plurality of timings to generate a plurality of digitized monitor signals, each of the plurality of digitized monitor signals having a first size; and a compression circuit configured to compress the plurality of digitized monitor signals into first data having the first size.

Hereinafter, embodiments will be described with reference to the drawings.

(Configuration of Test System)

Figure 1:
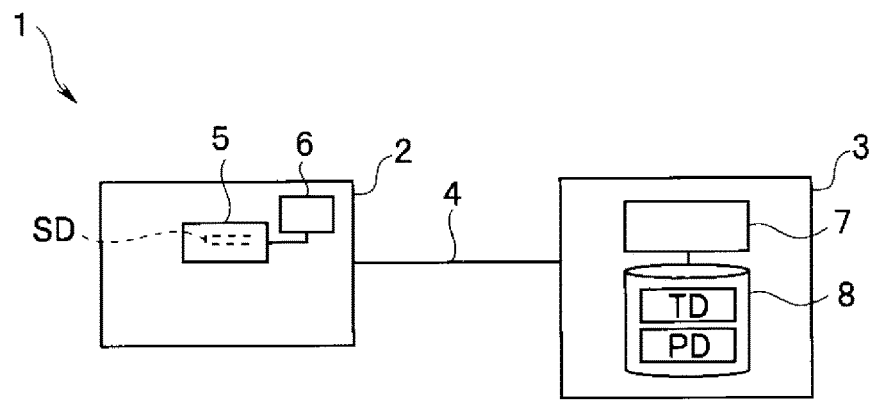
FIG. 1 is a configuration example of a product test system according to an embodiment.

FIG. 1 is a configuration view of a product test system according to an embodiment.

A product test system 1 includes a test device 2 and a management device 3. The test device 2 and the management device 3 each have a communication interface (not illustrated), and are connected to each other by a signal line 4 (or a network) to be able to communicate with each other. The product test system 1 can test a test target product, and acquire, store, and manage test result data TD and process characteristic data PD described later. The test target product is, for example, one or more semiconductor devices SD (illustrated by a dotted line).

Each semiconductor device SD has at least two operation modes. The two operation modes are referred to herein as a normal operation mode NM and a test mode TM. The normal operation mode NM is a mode in which the semiconductor device SD operates to realize a predetermined function according to its product specifications. In the normal operation mode NM, a process of writing data to the semiconductor device SD and reading data from the semiconductor device SD is performed. The test mode TM is a mode for testing the operation of the internal circuit of the semiconductor device SD. The operation mode can be switched by applying a predetermined signal to a predetermined pad of each semiconductor device SD. A processor 15 (described later) of the semiconductor device SD executes a process according to the operation mode.

The test device 2 includes a measuring device 5 and a test control device 6. The test control device 6 has a processor including a central processing unit (CPU), a read-only memory (ROM), a random access memory (RAM), and the like. The test control device 6 can control the measuring device 5 and communicate with the management device 3 through the signal line 4.

The test target product (semiconductor device SD) may be installed in the measuring device 5. A semiconductor wafer or a semiconductor package (not illustrated) on which one or more semiconductor devices SD are formed is installed in the measuring device 5.

The measuring device 5 is configured to supply power to each semiconductor device SD, transmit and receive signals to and from each semiconductor device SD, and the like via, for example, a probe or a test socket (not illustrated). The measuring device 5 sets the operation mode of the semiconductor device SD to the test mode TM, and then inputs test signals while applying the power supply voltage for the test to the semiconductor device SD. The measuring device 5 tests the functions and characteristics of the semiconductor device SD by observing output signals from each semiconductor device SD. The test is, for example, a shipping test performed on each semiconductor device SD before shipping during the mass production.

The test control device 6 causes the measuring device 5 to test the semiconductor device SD based on a test execution instruction from the management device 3. The test control device 6 outputs the test result data TD of each semiconductor device SD obtained in the measuring device 5 to the management device 3. The test result data TD includes, for example, data indicating whether each semiconductor device SD is a non-defective product or a defective product. The test control device 6 also outputs the process characteristic data PD (signature code SiG described later) obtained for each semiconductor device SD during the test, to the management device 3.

The management device 3 includes a processor 7 including a central processing unit (CPU), a ROM, and a RAM, and a large-capacity storage device 8. The processor 7 transmits the test execution instruction to the test device 2 (more specifically, the test control device 6) based on an instruction of a person in charge of testing the semiconductor device SD (hereinafter, referred to as a tester). As described above, when the test device 2 receives the test execution instruction from the management device 3, the test device 2 tests one or more mounted semiconductor devices SD according to a predetermined procedure. The processor 7 stores the test result data TD and the process characteristic data PD received from the test device 2 in the storage device 8. The test result data TD and the process characteristic data PD are stored in the storage device 8 in association with identification information (for example, identifier (ID)) given to each semiconductor device SD.

For example, if the shipped product is defective, the tester reads the test result data TD and the process characteristic data PD stored in the storage device 8. The tester can analyze the cause of defects based on these data.

(Configuration of Semiconductor Device which is Test Target)

Figure 2:
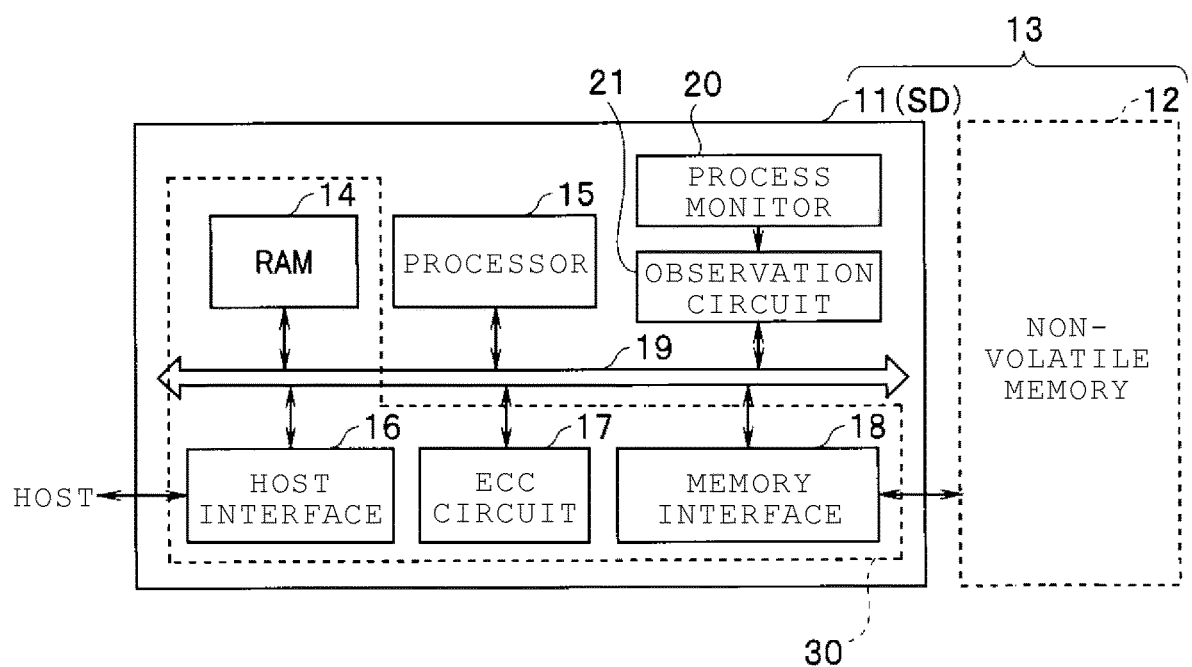
FIG. 2 is a block diagram illustrating a configuration example of a semiconductor device according to the embodiment.

FIG. 2 is a block diagram illustrating a configuration example of the semiconductor device SD according to the embodiment. In the embodiment, the semiconductor device SD is a controller of a memory system, that is, a memory controller 11. The memory controller 11 is configured to be connectable to a non-volatile memory 12. The memory controller 11 controls writing and reading of data to and from the non-volatile memory 12.

The memory system 13 is configured with the memory controller 11 and the non-volatile memory 12. The memory system 13 may be configured as one semiconductor device.

The memory system 13 may be configured as, for example, a memory card or a solid state drive (SSD).

The memory system 13 can be connected to a host. The host is an information processing device such as a personal computer or a mobile terminal.

The non-volatile memory 12 is a semiconductor storage device that stores data non-volatilely. The non-volatile memory 12 is, for example, a NAND type flash memory. The non-volatile memory 12 includes a plurality of blocks. Each block includes a plurality of memory cell transistors. Each memory cell transistor can store one bit or more of data.

The memory controller 11 includes a RAM 14, a processor 15, a host interface 16, an error check and correct (ECC) circuit 17, a memory interface 18, a process monitor 20, and an observation circuit 21. The RAM 14, the processor 15, the host interface 16, the ECC circuit 17, the memory interface 18, the process monitor 20, and the observation circuit 21 are connected to each other by an internal bus 19. The RAM 14, the host interface 16, the ECC circuit 17, and the memory interface 18 configure a functional circuit unit 30. The memory controller 11 may further include a ROM (not illustrated) that stores individual identification information (ID) for each semiconductor device SD. This ROM may be configured as a fuse ROM or a one-time-programmable (OTP) ROM.

The memory controller 11 writes data to the non-volatile memory 12 in response to a write request from the host. The memory controller 11 reads data from the non-volatile memory 12 in response to a read request from the host and outputs the data to the host.

The process monitor 20 and the observation circuit 21 are used when the operation mode of the semiconductor device SD is the test mode TM (that is, during the test), and operate continuously during the test.

Figure 3:
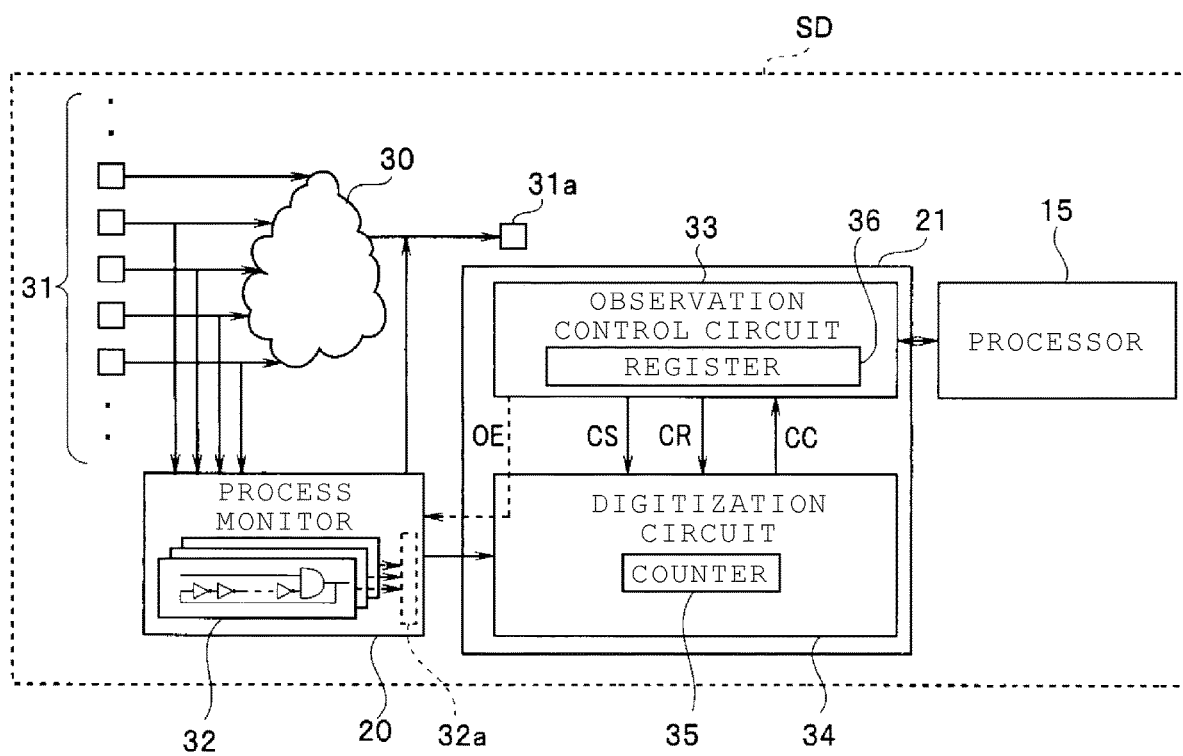
FIG. 3 is a block diagram of the semiconductor device illustrating a configuration of a process monitor and an observation circuit according to the embodiment.

FIG. 3 is a block diagram of the semiconductor device SD illustrating the configuration of the process monitor 20 and the observation circuit 21. As described above, the process monitor 20, the observation circuit 21, the functional circuit unit 30, and the processor 15 are provided in the semiconductor device SD (e.g., memory controller 11).

The semiconductor device SD has a plurality of pads 31. The plurality of pads 31 are used for input and output of power, various control signals, and write/read data between a power source, the host, and the non-volatile memory 12 in the normal operation mode NM. In the test mode TM, the plurality of pads 31 are used for input and output of the power, a control signal, and test data for the test mode TM.

The plurality of pads 31 include one or more input pads, and one or more output pads. One pad 31a among the plurality of pads 31 is for the output of the process monitor 20. The pad 31a is used to monitor the output signal of the process monitor 20 under a specific operation mode.

When a predetermined signal is input to one or more of the input pads 31 in the test mode TM, a signal from the circuit of the test target is output from the output pad 31. As will be described later, the test of each semiconductor device SD is performed for a plurality of test items. For each test item, the test of the operation of each semiconductor device SD is performed while the operating voltage is changed from the minimum voltage to the maximum voltage of its product specifications, and the operating temperature is changed from the minimum temperature to the maximum temperature of its product specifications.

That is, in the test mode TM, tests for a plurality of test items having different operating voltages and operating temperatures are performed in a predetermined order on the semiconductor device SD. During the test for each test item, signals according to each test item are input to one or more of the input pads 31, and various signals are output from one or more of the output pads 31.

The process monitor 20 and the observation circuit 21 operate when the semiconductor device SD is being tested in the test mode TM. In other words, the process monitor 20 and the observation circuit 21 can operate in the test mode TM during the execution of tests for a plurality of test items having different operating voltages and operating temperatures.

The process monitor 20 includes, for example, a ring oscillator 32. The ring oscillator 32 is a circuit having process sensitivity of the semiconductor device SD, that is, a circuit that outputs a signal related to a predetermined characteristic according to the manufacturing process of the semiconductor device SD. That is, the process monitor 20 is a monitor circuit that outputs a signal indicating a predetermined characteristic according to the semiconductor manufacturing process as a monitor signal.

When the semiconductor device SD (e.g., memory controller 11) manufactured under a first manufacturing process condition operates at a first operating voltage at a first temperature, the process monitor 20 outputs a signal having a first characteristic as a monitor signal. When the semiconductor device SD manufactured under a second manufacturing process condition different from the first manufacturing process condition operates at the first operating voltage at the first temperature, the process monitor 20 outputs a signal having a second characteristic different from the first characteristic as a monitor signal.

The ring oscillator 32 outputs a clock signal as an output signal, according to an enable signal OE from the observation circuit 21 (more specifically, the observation control circuit 33 described later).

The oscillation frequency of the output signal from the ring oscillator 32 changes according to three parameters such as the manufacturing process (P), the operating voltage (V), and the operating temperature (T) (hereinafter, referred to as PVT parameters) of the semiconductor device SD, and thus, the process monitor 20 is a circuit having process sensitivity. The process monitor 20 may include only one ring oscillator 32, or may include a plurality (three in the example illustrated in FIG. 3) of ring oscillators having different process sensitivities according to the test item.

When the oscillation frequency of the output signal from the ring oscillator 32 is increased, the process sensitivity becomes too high. That is, when the oscillation frequency of the ring oscillator 32 is increased, the amount of change in the oscillation frequency with respect to the amount of change in the PVT parameter of the semiconductor device SD becomes extremely large. The process monitor 20 may include a frequency dividing circuit for lowering the frequency accordingly.

The oscillation frequency of the output signal from the ring oscillator 32 is adjusted such that a plurality of signature codes SiG can be compared. The plurality of signature codes SiG are generated by signature compression described later. The oscillation frequency of the output signal from the ring oscillator 32 is adjusted such that the signature code SiG is substantially the same between the semiconductor devices SD manufactured by the same manufacturing process.

The process monitor 20 may further include a selection circuit 32a, as illustrated by the dotted line in FIG. 3. The selection circuit 32a selectively switches the outputs of the plurality of ring oscillators 32 according to the process sensitivity. The selection circuit 32a also masks some of the outputs of the plurality of ring oscillators 32 according to the process sensitivity. The selection circuit 32a also adjusts the number of outputs within a predetermined period (for example, test time), that is, a frequency of outputs, from one of the plurality of ring oscillators 32 according to the process sensitivity.

By providing the selection circuit 32a, an appropriate count value CC (described later) can be obtained according to the process sensitivity.

Here, the ring oscillator 32 is used as a circuit having the process sensitivity, but a delay circuit, a voltage dividing circuit, or the like may be used as a circuit having the process sensitivity.

In the embodiment, the process monitor 20 is a dedicated circuit for testing. The process monitor 20 may be a circuit also used in the normal operation mode NM.

The output signal from the process monitor 20 is supplied to the observation circuit 21. The observation circuit 21 includes an observation control circuit 33 and a digitization circuit 34.

The observation control circuit 33 operates when the semiconductor device SD is in the test mode TM. The observation control circuit 33 outputs the enable signal OE to the process monitor 20 in the test mode TM. The observation control circuit 33 also repeatedly outputs a count signal CS and a reset signal CR to the digitization circuit 34 in a predetermined cycle RC in the test mode TM.

Therefore, the observation control circuit 33 includes a timer circuit (not illustrated) for measuring the predetermined cycle RC. That is, the observation control circuit 33 outputs the count signal CS in response to an instruction from the processor 15, and stops the output of the count signal CS after the elapse of the predetermined cycle RC. The timer measures the cycle RC as a fixed time independently from the operation of the processor 15. The observation control circuit 33 is configured to output the reset signal CR in response to an instruction from the processor 15.

The digitization circuit 34 includes a counter 35. The counter 35 counts the number of pulses according to the oscillation frequency of the output signal (here, the output signal from the ring oscillator 32) from the process monitor 20. The counter 35 counts the output signal from the process monitor 20 according to the count signal CS from the observation control circuit 33. The counter 35 resets the counted value CC according to the reset signal CR from the observation control circuit 33.

The counter 35 obtains the counted value CC that is updated by the output signal from the process monitor 20 while the count signal CS is input in the predetermined cycle RC. The digitization circuit 34 converts the oscillation frequency of the output signal from the ring oscillator 32 into a digital value (here, the counted value CC). The counted value CC of the counter 35 is read by the observation control circuit 33.

Accordingly, the digitization circuit 34 digitizes the monitor signal from the process monitor 20, which is a monitor circuit, at a plurality of timings within a predetermined period (within the test period). The digitization circuit 34 outputs the digitized monitor signal as a plurality of pieces of numerical data (i.e., a plurality of the counted values 34). The digitization of the output from the process monitor 20 is performed in the predetermined cycle RC.

If the process monitor 20 includes a plurality of ring oscillators 32, the digitization circuit 34 may digitize the oscillation frequencies of the output signals from at least one of the plurality of ring oscillators 32 and output the digitized oscillation frequency as a plurality of pieces of numerical data.

As described above, the process monitor 20 operates during the execution of the test operations of the plurality of test items. The process monitor 20 outputs a signal indicating a predetermined characteristic according to the manufacturing process of the semiconductor device SD as a monitor signal. The output from the process monitor 20 is digitized at a plurality of timings within a predetermined period (test period), and a plurality of pieces of numerical data can be obtained.

When the process monitor 20 is a voltage dividing circuit, the digitization circuit 34 is an analog-to-digital converter that converts the voltage level of the voltage dividing circuit into digital data.

The observation control circuit 33 includes a register 36. The observation control circuit 33 stores the counted value CC acquired from the digitization circuit 34 in the register 36. The counted value CC in the register 36 is read by the processor 15.

When the process monitor 20 includes a plurality of ring oscillators 32, the digitization circuit 34 includes a plurality of counters 35. Here, a plurality of counted values CC are stored in the register 36.

Figure 4:
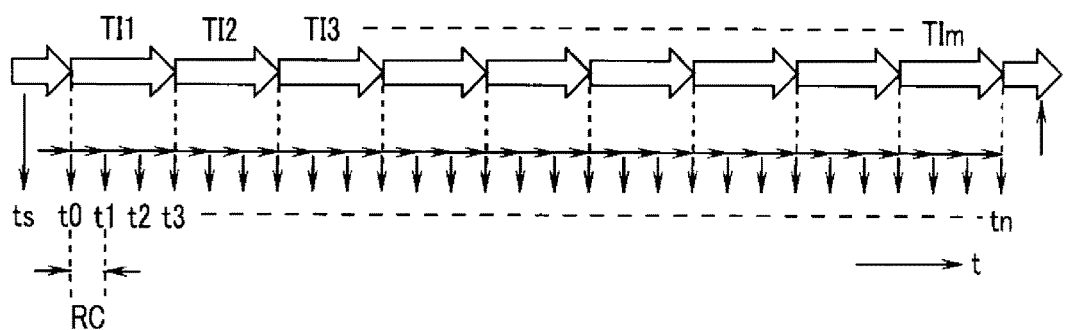
FIG. 4 is a timing chart illustrating an output timing of a counted value during a test of the semiconductor device according to the embodiment.

FIG. 4 is a timing chart illustrating an output timing of the counted value CC during a test of the semiconductor device SD.

When the semiconductor device SD enters the test mode TM, at a timing ts, the processor 15 executes an initialization process including setting the time of the timer of the observation control circuit 33 and clearing the register 36. After the initialization process, tests are executed in a predetermined order for a plurality (here, m (m is a positive integer)) of test items.

The measuring device 5 performs a scan test, a communication operation, and the like while changing the operating voltage, the operating temperature, and the like based on the product specifications of the semiconductor device SD. The process monitor 20 continues to operate while the tests for the plurality of test items are continuously executed in a predetermined order.

The observation circuit 21 stores the counted value CC in the register 36 every predetermined cycle RC. In the example illustrated in FIG. 4, the counter 35 starts counting at a timing t0, and the counter 35 continues counting for a period until a timing t1 thereafter. The period from the timing t0 to the timing t1 corresponds to a period during which the count signal CS is asserted, that is, the cycle RC.

When the count signal CS is negated, the count-up of the counter 35 stops. The observation control circuit 33 acquires the counted value CC of the counter 35 and stores the acquired counted value CC in the register 36. By receiving the reset signal CR, the counter 35 is reset.

Similarly, after the timing t1, the register 36 stores the counted value CC for each predetermined cycle RC.

First, the test for a test item TI1 is executed, and meanwhile, the counted value CC for each predetermined cycle RC is stored in the register 36. After the test item TI1, the test for a test item TI2 is executed, and meanwhile, the counted value CC for each predetermined cycle RC is stored in the register 36. Hereinafter, the test is executed in the same manner. When the test for a last m-th test item TIm is completed, the storing of the counted value CC in the register 36 is stopped.

The test for each test item is executed for a predetermined time according to a predetermined procedure. Therefore, the time from the start of the test of the first test item TI1 to the end of the test of the last test item TIm is constant.

The processor 15 acquires the counted value CC in the register 36, which has been stored in the predetermined cycle RC. In the example illustrated in FIG. 4, the processor 15 acquires n counted values CC. The processor 15 may acquire the counted value CC in the register 36 at any timing including during the test for each test item or after the test for all the test items.

The processor 15 performs data compression of the obtained counted value CC. The processor 15 functions as a compression circuit that compresses a plurality of pieces of numerical data acquired from the observation circuit 21.

Figure 5:
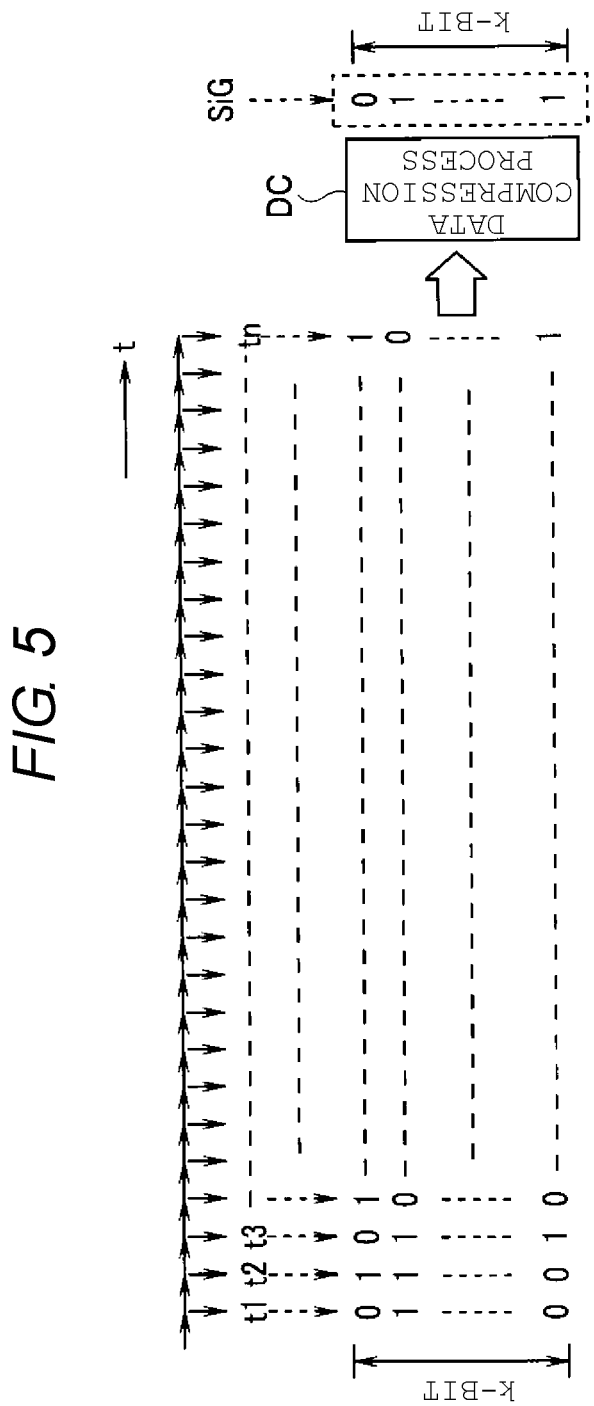
FIG. 5 is a view illustrating an example of a compression process of the counted value, according to the embodiment.

FIG. 5 is a view illustrating an example of a compression process of the counted value. The n counted values CC obtained from the timings t1 to tn are data-compressed by the processor 15. Here, the data compression is referred to as signature compression. The n counted values CC are converted into one signature code SiG. According to the signature compression, data of k-bit size is compressed into the same size (k-bit) of data regardless of the number of pieces of data, which increases as the number of predetermined cycles RC increases. That is, the plurality of counted value CCs are compressed into data having a size equal to the data size of each counted value CC. As illustrated in FIG. 5, the processor 15 acquires a plurality of k-bit counted values CC over time. The processor 15 performs data compression process DC on the plurality of k-bit counted values CC. Accordingly, the plurality of k-bit counted values CC are compressed into k-bit data. That is, by the signature compression, the plurality of counted values CC are compressed in a time domain.

The data compression process DC for performing the signature compression of the counted value CC may be performed by the processor 15 or may be performed by using a dedicated circuit (e.g., multi-input signature register (MISR)).

The test control device 6 communicates with the processor 15 and acquires the test result data TD and the process characteristic data PD (here, signature code SiG) of the tested semiconductor device SD from the processor 15. The test control device 6 transmits the test result data TD and the process characteristic data PD one or more semiconductor devices SD to the management device 3 in response to an instruction from the management device 3.

The processor 7 of the management device 3 stores the acquired test result data TD and the process characteristic data PD (signature code SiG) of each semiconductor device SD in the storage device 8 in association with the identification information of each semiconductor device SD.

As a result, the storage device 8 stores a plurality of signature codes SiG for each of the plurality of tested semiconductor devices SD.

For example, various characteristics of the manufactured semiconductor device SD vary due to changes in the production line, changes in the material manufacturer, and the like. The variation in various characteristics is due to the manufacturing process (P). The signature code SiG reflects not only the manufacturing process (P) but also a plurality of operating voltages (V) and operating temperatures (T) of the semiconductor device SD in a plurality of predetermined test items. Accordingly, two signature codes SiG obtained from two semiconductor devices SD manufactured by the same manufacturing process (P) match each other. Meanwhile, two signature codes SiG obtained from two semiconductor devices SD manufactured by different manufacturing processes (P) may not match each other. In other words, changes in the manufacturing process (P) can be detected by comparing the plurality of signature codes SiG.

(Operation)

Next, the operation of the product test system 1 will be described.

Figure 6:
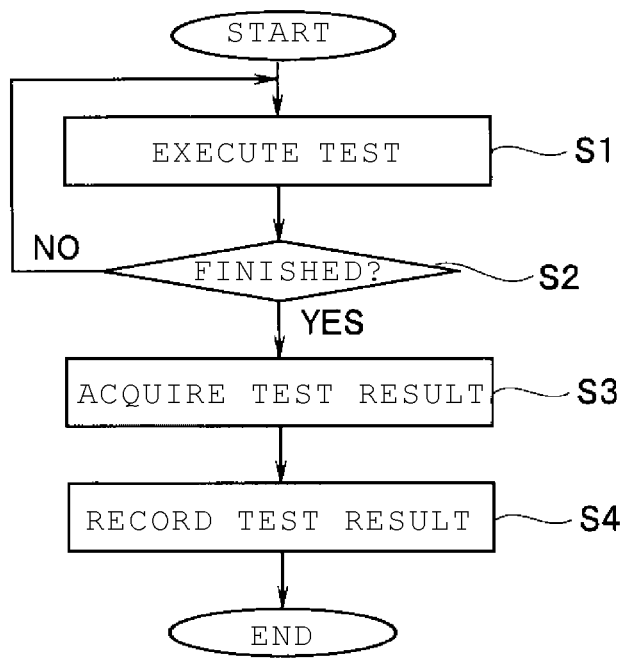
FIG. 6 is a flowchart illustrating an example of a process of a processor of a management device during a shipping test according to the embodiment.
Figure 7:
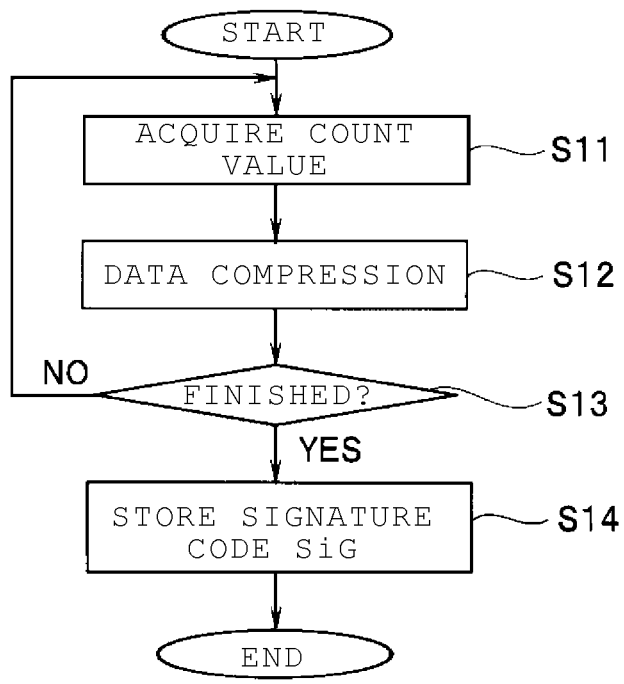
FIG. 7 is a flowchart illustrating an example of a process in a semiconductor device during the shipping test according to the embodiment.

FIGS. 6 and 7 are flowcharts illustrating an example of a process during the shipping test of the semiconductor device SD. FIG. 6 is a flowchart illustrating an example of a process of the processor 7 of the management device 3 during the shipping test.

The process illustrated in FIG. 6 is implemented by the processor 7 executing software stored in a storage device such as a ROM. The process illustrated in FIG. 6 is executed when the test is started. The processor 7 of the management device 3 instructs the execution of the test of the semiconductor device SD to the test control device 6 (S1). The processor 7 determines whether the tests of all the test items are completed (S2). When the tests of all the test items are not completed (S2: NO), the process returns to S1.

When the tests of all the test items are completed (S2: YES), the processor 7 acquires the test result data TD and the process characteristic data PD (that is, the signature code SiG) from the test control device 6 of the test device 2 (S3). The processor 7 records the test result data TD and the process characteristic data PD in the storage device 8 in association with the identification information (ID) of the semiconductor device SD (S4).

FIG. 7 is a flowchart illustrating an example of the flow in the semiconductor device SD during the shipping test. The process of FIG. 7 is executed in the semiconductor device SD in parallel with the execution of the test of S1 of the flowchart of FIG. 6. As described above, the processor 15 acquires the counted value CC at every predetermined cycle RC (S11).

The processor 15 combines the acquired counted value and the previous value and compresses the combined values as a signature (S12). The processor 15 determines whether the acquisition and compression of the counted value CC for all the test items are completed (S13). When the acquisition and compression of the counted value CC for all the test items are not completed (S13: NO), the process returns to S11.

When the acquisition and compression of the counted values CC for all the test items are completed (S13: YES), the processor 15 stores the signature code SiG generated by the data compression of the plurality of counted values CC in a predetermined register in the processor 15 or in the RAM 14 (S14). The stored signature code SiG is acquired by the processor 7 of the management device 3 in S3 of the flowchart of FIG. 6.

The management device 3 instructs the execution of the test of a plurality of predetermined test items, and collects the test result data of each test item. The management device 3 determines whether each semiconductor device SD is a non-defective product or a defective product. The management device 3 records the test result data TD including the non-defective product/defective product information in the storage device 8 in association with the identification information (ID) read from each semiconductor device SD. The management device 3 also records the process characteristic data PD (signature code SiG) acquired from each semiconductor device SD in the storage device 8 in association with the identification information (ID). That is, the management device 3 acquires and records the signature code SiG when a series of tests for a plurality of test items on each semiconductor device SD is completed.

FIG. 8 is a view illustrating an example of the process characteristic data PD. The process characteristic data PD includes an item of identification information (product ID) of each semiconductor device SD and an item of signature code SiG. The signature code SiG is stored in association with the identification information. Accordingly, the tester can search the signature code SiG of each semiconductor device SD stored in the storage device 8.

For example, when there is a semiconductor device SD returned to a semiconductor device manufacturer as a defective product, an analyst in charge of analyzing the cause of defects reads the identification information of the semiconductor device SD from the semiconductor device 8. The analyst reads the process characteristic data PD from the storage device 8 and specifies the signature code SiG corresponding to the identification information.

The analyst can specify another semiconductor device SD having the same signature code SiG as the specified signature code SiG, from the process characteristic data PD stored in the storage device 8. There is a possibility that the semiconductor devices SD having the same signature code SiG as the defective semiconductor device SD have the same defects as that of the defective semiconductor device SD.

Further, the analyst can analyze the cause of defects by analyzing the manufacturing recipe when the semiconductor devices SD having the same signature code SiG as that of the defective semiconductor device SD are manufactured.

FIG. 9 is a view illustrating a process from trial production to mass production of the semiconductor device SD.

A prototype semiconductor device SD is initially tested. In the initial test, the functions and characteristics of the prototype semiconductor device SD are evaluated.

After the predetermined functions and characteristics of the semiconductor device SD are evaluated in the initial test, a certification test is performed. The certification test includes evaluation of variations in various characteristics during mass production and a long-term durability test under conditions based on the product specifications of the semiconductor device SD. Based on the results of the certification test, the test method (including pass criterion) during the mass production is determined.

When the mass production begins, medium-scale initial mass production is performed first, and then large-scale initial mass production is performed.

In the shipping test during the mass production, each manufactured semiconductor device SD is tested based on the test method determined from the result of the certification test. The semiconductor device SD that satisfies the determined pass criterion is shipped because the device is a non-defective product. The semiconductor device SD that does not satisfy the determined pass criterion is not shipped because the device is a defective product.

However, the test during the mass production cannot be performed under all conditions for all the functions and all the characteristics of the semiconductor device SD. Thus, test items only for a predetermined function and a predetermined characteristic under a predetermined condition are tested during the mass production.

Therefore, there is a possibility that a defect occurs even from the semiconductor device SD which passed the shipping test during the mass production. There is a possibility that a defect occurs even from another semiconductor device SD which was manufactured by the same manufacturing process (P) and passed the shipping test during the mass production.

That is, if there is one defective semiconductor device SD among many semiconductor devices SD shipped under such manufacturing and testing, it is assumed that there is a concern that similar defect occurs even from other semiconductor devices SD of which the signature codes SiG match each other.

The semiconductor device SD according to the above-described embodiment digitizes the output signal of the process monitor 20 under the shipping test at the predetermined cycle RC. The semiconductor device SD can compress and output a digitized output signal. The product test system 1 stores the compressed output signal in the storage device 8 in association with the identification information (ID).

Accordingly, when there is a defect in the semiconductor device SD which passed the shipping test, it is possible to specify, by using the signature codes SiG, a plurality of other semiconductor devices SD having a possibility of occurrence of similar defects. By performing various tests or analysis on the plurality of other specified semiconductor devices SD, it is possible to take measures to prevent the plurality of other specified semiconductor devices SD from being shipped to the market as defective products.

Further, by verifying the manufacturing process of a plurality of semiconductor devices SD of which the signature codes SiG match each other, it is possible to analyze the cause of the occurrence of the defect.

FIG. 10 is a view illustrating an example of a histogram of the signature code SiG. The processor 7 of the management device 3 can process a large amount of signature code SiG data stored in the storage device 8 to generate a histogram of the signature code SiG. FIG. 10 illustrates an example of a histogram in which occurrence frequency for each signature code SiG of semiconductor devices SD is arranged in ascending order.

In FIG. 10 illustrates, from left to right, the occurrence frequency distribution from a signature code SiG having low occurrence frequency to a signature code SiG having high occurrence frequency. Even in the semiconductor device SD which passed the shipping test satisfying the product specifications, the occurrence frequency of the signature code SiG varies depending on the characteristics of each semiconductor device SD. By using the histogram, it is possible to manage the occurrence frequency as a distribution.

Further, in a case where a plurality of process monitors 20 are provided in the semiconductor device SD, by creating the histogram for each process monitor 20, a process monitor 20 suitable for analysis of the cause of defects can also be selected.

Accordingly, by managing the distribution of the signature code SiG of the semiconductor device SD shipped as a non-defective product in the past, it is possible to notice that the signature code SiG that did not occur in the past was generated in the shipping test. Here, for example, even when the semiconductor device SD passed the shipping test, it is possible to verify whether there is a potential defect, by adding an item to the shipping test or by testing the item performed in the initial evaluation. When the semiconductor device SD fails in a test item other than the shipping test, by adding that item to the shipping test, it is possible to prevent the shipment of potentially defective products.

As described above, in the above-described embodiment, the process monitor 20 continues to operate independently from the other circuits during the test mode. The observation circuit 21 acquires and digitizes the output signal for each predetermined cycle RC. Therefore, the counted value CC can be stored in the register 36 without receiving an external control signal. The processor 15 can acquire the counted value CC and generate the signature code SiG.

Accordingly, when a plurality of test items are being tested, the processor 15 can obtain the process characteristic data PD indicating changes in PVT parameters of the semiconductor device SD. That is, the semiconductor device SD can digitize and collect the output of the process monitor 20 during the shipping test, and output the signature code SiG when the test is completed.

As described above, according to the above-described embodiment, it is possible to provide a memory system and a management method of characteristic information of a semiconductor device that prevent defective products from being shipped to the market by detecting a characteristic change that is not large enough to cause defects in a shipping test, and make it easy to analyze the cause of defects.

According to the above-described embodiment, since the characteristic information of the semiconductor device SD is encoded, it is also easy to compare the test result data.

According to the above-described embodiment, when there is a semiconductor device SD having the same signature code SiG as the signature code SiG of a defective product, or when a signature code different from the signature codes SiG of the semiconductor devices SD shipped in the past is generated in the shipping test, it is possible to prevent the shipment of defective products by performing tests other than the shipping test.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a non-volatile memory; and
   a memory controller configured to control the non-volatile memory, the memory controller including:
   at least one monitor circuit configured to generate a monitor signal indicating at least one characteristic that varies based on a variation in a manufacturing process condition under which the memory controller was manufactured;
   a digitization circuit configured to digitize the monitor signal at a plurality of timings to generate a plurality of digitized monitor signals, each of the plurality of digitized monitor signals having a first size; and
   a compression circuit configured to compress the plurality of digitized monitor signals into first data having the first size.

2. The memory system according to claim 1, wherein
   the memory controller has a test mode for testing an operation of an internal circuit, and
   the plurality of digitized monitor signals are generated during a first period during which the memory controller is operating in the test mode.

3. The memory system according to claim 1, wherein the monitor circuit is further configured to:
   output the monitor signal with a first characteristic in a case where the memory controller was manufactured under a first manufacturing process condition and the memory controller operates at a first operating voltage at a first temperature, and output the monitor signal with a second characteristic different from the first characteristic in a case where the memory controller was manufactured under a second manufacturing process condition different from the first manufacturing process condition and the memory controller operates at the first operating voltage at the first temperature.

4. The memory system according to claim 1, wherein the at least one monitor circuit includes a plurality of monitor circuits, and the digitization circuit is configured to digitize the monitor signal of each of the plurality of monitor circuits.

5. The memory system according to claim 1, wherein the monitor circuit is configured to adjust a frequency of output of the generated monitor signal.

6. The memory system according to claim 1, wherein the compression circuit is configured to compress the plurality of digitized monitor signals in a time domain.

7. The memory system according to claim 1, wherein the compression circuit is configured to signature-compress the plurality of digitized monitor signals in a time domain.

8. The memory system according to claim 1, wherein the compression circuit is configured to compress the plurality of digitized monitor signals into the first data having the first size regardless of the number of the plurality of digitized monitor signals.

9. The memory system according to claim 1, wherein the monitor circuit includes at least one of a ring oscillator, a delay circuit, or a voltage dividing circuit configured for digitizing an internal voltage value.

10. A management method of characteristic information of a semiconductor device, the semiconductor device including at least one monitor circuit, a digitization circuit, and a compression circuit, the method comprising:

executing a first test at a first operating voltage and a first operating temperature on a plurality of semiconductor devices;

instructing the at least one monitor circuit to generate, during the first test, a monitor signal indicating at least one characteristic that varies based on a variation in a manufacturing process condition under which the semiconductor device was manufactured;

instructing the digitization circuit to digitize, during the first test, the monitor signal at a plurality of timings to generate a plurality of digitized monitor signals, each of the plurality of digitized monitor signals having a first size;

instructing the compression circuit to compress, during the first test, the plurality of digitized monitor signals into characteristic information having the first size;

obtaining the characteristic information from each of the plurality of semiconductor devices; and associating, in a storage device, identification information of each of the plurality of semiconductor devices and the characteristic information of each of the plurality of semiconductor devices with each other.

11. The management method according to claim 10, further comprising:

storing, in the storage device, the characteristic information obtained from each of a plurality of first semiconductor devices determined to be non-defective among the plurality of semiconductor devices; and executing a second test on a second semiconductor device different from the plurality of first semiconductor devices, when the characteristic information obtained from the second semiconductor device is different from any of the characteristic information obtained from each of the plurality of first semiconductor devices stored in the storage device.

12. The management method according to claim 10, further comprising:

storing, in the storage device, the characteristic information obtained from each of the plurality of first semiconductor devices determined to be non-defective among the plurality of semiconductor devices; and determining that a second semiconductor device as a defective product, the second semiconductor device being different from the plurality of first semiconductor devices, when the characteristic information obtained from the second semiconductor device is different from any of the characteristic information obtained from each of the plurality of first semiconductor devices stored in the storage device.

13. A memory controller comprising:

at least one monitor circuit configured to generate a monitor signal indicating at least one characteristic that varies based on a variation in a manufacturing process condition under which the memory controller was manufactured;

a digitization circuit configured to digitize the monitor signal at a plurality of timings to generate a plurality of digitized monitor signals, each of the plurality of digitized monitor signals having a first size; and a compression circuit configured to compress the plurality of digitized monitor signals into first data having the first size.

14. The memory controller according to claim 13, wherein the memory controller has a test mode for testing an operation of an internal circuit, and the plurality of digitized monitor signals are generated during a first period during which the memory controller is operating in the test mode.

15. The memory controller according to claim 13, wherein the monitor circuit is further configured to:

output the monitor signal with a first characteristic in a case where the memory controller was manufactured under a first manufacturing process condition and the memory controller operates at a first operating voltage at a first temperature, and output the monitor signal with a second characteristic different from the first characteristic in a case where the memory controller was manufactured under a second manufacturing process condition different from the first manufacturing process condition and the memory controller operates at the first operating voltage at the first temperature.

16. The memory controller according to claim 13, wherein the monitor circuit is configured to adjust a frequency of output of the generated monitor signal.

17. The memory controller according to claim 13, wherein the compression circuit is configured to compress the plurality of digitized monitor signals in a time domain.

18. The memory controller according to claim 13, wherein the compression circuit is configured to signature-compress the plurality of digitized monitor signals in a time domain.

19. The memory controller according to claim 13, wherein
   the compression circuit is configured to compress the plurality of digitized monitor signals into the first data having the first size regardless of the number of the plurality of digitized monitor signals.

20. The memory controller according to claim 13, wherein
   the monitor circuit includes at least one of a ring oscillator, a delay circuit, or a voltage dividing circuit configured for digitizing an internal voltage value.

* * * * *